United States Patent
Chiu

(10) Patent No.: US 12,237,436 B2
(45) Date of Patent: Feb. 25, 2025

(54) WELDING METHOD FOR WELDING STRIP OF BACK-CONTACT SOLAR CELL CHIP

(71) Applicant: Golden Solar (Quanzhou) New Energy Technology Co., Ltd., Quanzhou (CN)

(72) Inventor: Hsin-wang Chiu, Quanzhou (CN)

(73) Assignee: GOLDEN SOLAR (QUANZHOU) NEW ENERGY TECHNOLOGY CO., LTD., Quanzhou (CN)

(*) Notice: Subject to any disclaimer, the term of this patent is extended or adjusted under 35 U.S.C. 154(b) by 525 days.

(21) Appl. No.: 17/457,668

(22) Filed: Dec. 5, 2021

(65) Prior Publication Data

US 2022/0320364 A1 Oct. 6, 2022

(30) Foreign Application Priority Data

Mar. 30, 2021 (CN) .......................... 202110337564.4

(51) Int. Cl.
*H01L 31/18* (2006.01)
*B23K 9/127* (2006.01)
(Continued)

(52) U.S. Cl.
CPC ........ *H01L 31/1876* (2013.01); *B23K 9/1274* (2013.01); *H01L 31/022441* (2013.01); *H01L 31/0504* (2013.01); *H01L 31/0516* (2013.01)

(58) Field of Classification Search
CPC ........... H01L 31/02008; H01L 31/0201; H01L 31/18; H01L 31/042; H01L 31/188; H01L 31/0504; H01L 31/0516
See application file for complete search history.

(56) References Cited

U.S. PATENT DOCUMENTS 4,443,652 A * 4/1984 Izu .................. H01L 31/076
136/258
4,485,264 A * 11/1984 Izu .................. H01L 31/206
257/E27.125
(Continued)

FOREIGN PATENT DOCUMENTS

CN 204230264 U 3/2015
CN 107199383 A 9/2017
(Continued)

OTHER PUBLICATIONS

Musa T. Zarmai, et al., A review of interconnection technologies for improved crystalline silicon solar cell photovoltaic module assembly, Applied Energy, 2015, pp. 173-182, vol. 154.

*Primary Examiner* — David A Zarneke
(74) *Attorney, Agent, or Firm* — Bayramoglu Law Offices LLC

(57) ABSTRACT

A welding method for a welding strip of a back-contact solar cell chip includes the following steps: firstly, welding small chip assemblies of a back-contact solar cell to be interconnected to form a small cell string through an interconnected bar; then, punching the small cell string into small cell assemblies separated from each other through a cutting or punching process; subsequently, flexibly welding the small cell assemblies by a bus bar to reach a required length of a finished assembly product; and finally, breaking the bus bar through a post cutting or punching process to form cell assemblies with positive and negative electrodes connected in series or in parallel. The method makes the welding surfaces of the solar cell chips be on the same surface through using the back-contact solar cell chips, so that the interconnected bar of the solar cell chips can be welded rapidly and continuously.

7 Claims, 9 Drawing Sheets

(51) Int. Cl.
    *H01L 31/0224*     (2006.01)
    *H01L 31/05*     (2014.01)

(56) References Cited

U.S. PATENT DOCUMENTS

| | | | |
|---|---|---|---|
| 8,575,475 B2 * | 11/2013 | Sakamoto | H01L 31/02363 |
| | | | 136/243 |
| 11,103,078 B2 * | 8/2021 | Morrison | A47C 20/00 |
| 2011/0290298 A1 * | 12/2011 | Krause | H01L 31/022433 |
| | | | 438/57 |
| 2014/0124013 A1 * | 5/2014 | Morad | H02S 40/36 |
| | | | 136/246 |
| 2016/0380120 A1 * | 12/2016 | Terao | H01L 31/022441 |
| | | | 136/244 |
| 2018/0053876 A1 | 2/2018 | Iida | |

FOREIGN PATENT DOCUMENTS

| | | | |
|---|---|---|---|
| CN | 108687418 | A | 10/2018 |
| CN | 108723653 | A | 11/2018 |
| CN | 110299431 | A | 10/2019 |
| CN | 111185687 | A | 5/2020 |
| CN | 111192940 | A | 5/2020 |
| CN | 111203661 | A | 5/2020 |
| EP | 3447805 | A1 | 2/2019 |
| JP | 2003298095 | A | 10/2003 |

* cited by examiner

WELDING METHOD FOR WELDING STRIP OF BACK-CONTACT SOLAR CELL CHIP

CROSS REFERENCE TO THE RELATED APPLICATIONS

This application is based upon and claims priority to Chinese Patent Application No. 202110337564.4, filed on Mar. 30, 2021, the entire contents of which are incorporated herein by reference.

TECHNICAL FIELD

The present invention relates to the technical field of solar cells, and more particularly, to a welding method for a welding strip of a back-contact solar cell chip.

BACKGROUND

The traditional welding process of the interconnected bar of the solar cell chip is relatively tedious, because the positive and negative electrodes of the solar cell are on different surfaces, which requires both surfaces to be welded with the interconnected bar. Specifically, it needs to first arrange the welding strip of the negative electrode before chips are arranged, then the welding strip needs to be cut after the welding strip of the positive electrode is arranged; subsequently, the chips arranged with the welding strips at the positive electrode surface and the negative electrode surface are welded in series through a series welding machine, where the probability of defective products of solar chips in the production process is greatly increased because both surfaces are welded simultaneously.

SUMMARY

In view of the above problems, the present invention provides a welding method for a welding strip of a back-contact solar cell chip, which can realize rapid and continuous welding of the welding strip without requiring to cut off the interconnected bar, thus reducing the difficulty of the welding process and improving the working efficiency.

In order to solve the above technical problems, the technical solution adopted by the present invention is as follows. A welding method for a welding strip of a back-contact solar cell chip includes the following steps:
  welding small chip assemblies of a back-contact solar cell to be interconnected to form a small cell string through an interconnected bar;
  punching the small cell string into small cell assemblies separated from each other through a cutting or punching process;
  welding the small cell assemblies by a bus bar to reach a required length of a finished assembly product; and
  breaking the bus bar through a post cutting or punching process to form cell assemblies with positive and negative electrodes connected in series or in parallel.

Further, a method for welding the small chip assemblies of the back-contact solar cell to be interconnected to form the small cell string through the interconnected bar includes: transmitting a small chip assembly of the back-contact solar cell to a welding station through an automatic conveying belt; pressing down a pressing block for fixing the welding strip to fix the interconnected bar after the interconnected bar is clamped by a chuck and is pulled out by a required welding length, so that the interconnected bar is smoothly distributed on a surface of the small chip assembly; moving an infrared welding head down to touch the interconnected bar to start welding, so that the interconnected bar is uniformly and firmly fused with a welding joint of the small chip assembly, and a welding of a first small chip assembly is completed; after the infrared welding head and the pressing block for fixing the welding strip are lifted, automatically moving the conveying belt forward one chip station, and pulling, by the chuck, a front end of the interconnected bar to move forward one chip station simultaneously, then allowing a second small chip assembly to be in place; moving the infrared welding head down to touch the interconnected bar to start a welding of the second small chip assembly after the pressing block for fixing the welding strip is pressed down to fix the interconnected bar; meanwhile, loosening the chuck in the front of the first small chip assembly back to the front of the second small chip assembly to clamp the interconnected bar; lifting the pressing block for fixing the welding strip and the infrared welding head after the welding of the second small chip assembly is completed, and moving the small chip assembly and the interconnected bar forward one chip station simultaneously; and repeating above welding steps until N small chip assemblies are welded to be interconnected to form the small cell string.

Further, the small chip assembly is formed by attaching a protective layer to arranged 5×13 small cell chips affixed with an ultraviolet ray (UV) film.

Further, the interconnected bar is arranged under the small chip assembly to be welded; the small chip assembly is absorbed and transmitted to the welding station through a vacuum sucker on an automatic mechanical arm; a welding surface of the small chip assembly is facing down, and a surface of the attached protective layer is facing up.

Further, a method for welding the small cell assemblies by the bus bar to reach the required length of the finished assembly product includes: transmitting a small cell assembly to a welding station through an automatic conveying belt, and clamping and pulling the bus bar by a chuck to a required length; pressing a pressing block for fixing the bus bar down to fix the bus bar, so that the bus bar is tightly attached to the interconnected bar; moving an infrared welding head down to start welding, so that a welding of a first small cell assembly is completed; after the infrared welding head and the pressing block for fixing the bus bar are lifted, automatically moving the conveying belt forward one chip station, and clamping, by the chuck, a front end of the bus bar to move forward one chip station simultaneously, then allowing a second small cell assembly to be in place; pressing the infrared welding head down to perform a welding of the second small cell assembly after the pressing block for fixing the bus bar is pressed down to fix the bus bar; meanwhile, loosening the chuck in the front of the first small cell assembly back to the front of the second small cell assembly to clamp the bus bar; lifting the pressing block for fixing the bus bar and the infrared welding head after the welding of the second small cell assembly is completed, and moving the small cell assembly and the bus bar forward one chip station simultaneously; and repeating above welding steps until the required length of the finished assembly product is reached.

Further, the bus bar is welded by using a single-layer welding or a double-layer clamping welding, and the top and the bottom of the small cell assembly are respectively laid with the bus bar when the double-layer clamping welding is used.

Further, adjacent small cell assemblies are fed in a manner of one positive and one negative when the small cell assemblies are connected in series, so that positive and negative electrodes of the adjacent small cell assemblies are connected to each other during welding to allow all the small cell assemblies to be connected in series.

From the above description of the structure of the present invention, compared with the prior art, the present invention has the following advantages.

1. The present invention makes the welding surfaces of the solar cell chips be on the same surface through using the back-contact solar cell chips, so that the interconnected bar of the solar cell chips can be welded rapidly and continuously, and the welding of positive and negative electrodes on the same surface and the welding of multiple main grids at the same time are further achieved without requiring to cut off the interconnected bar, which greatly improves the work efficiency.
2. In the present invention, a hard protective layer is attached to the surface of the back-contact solar cell chip, thereby reducing the probability of producing defective products in the production process of the solar cell chip.
3. The small cell assembly formed through the cutting or punching process produced by the present invention can flexibly form the required finished cell assembly. Moreover, when the bus bar is welded, the process of first welding and then cutting or punching is different from the traditional process of first cutting the required length before welding. This reduces the difficulty of the welding process, improves the production efficiency and reduces the production cost.

BRIEF DESCRIPTION OF THE DRAWINGS

The drawings as a part of the present invention are used to provide a further understanding of the present invention, and the schematic embodiments of the present invention and the descriptions thereof are used to explain the present invention and do not constitute an undue limitation to the present invention. In the drawings.

DETAILED DESCRIPTION OF THE EMBODIMENTS

In order to make the objectives, technical solutions, and advantages of the present invention clearer, the present invention is further described in detail below with reference to the drawings and embodiments. It should be understood that the specific embodiments described herein are used only to explain the present invention instead of limiting the present invention.

Embodiment 1

Figure 1:
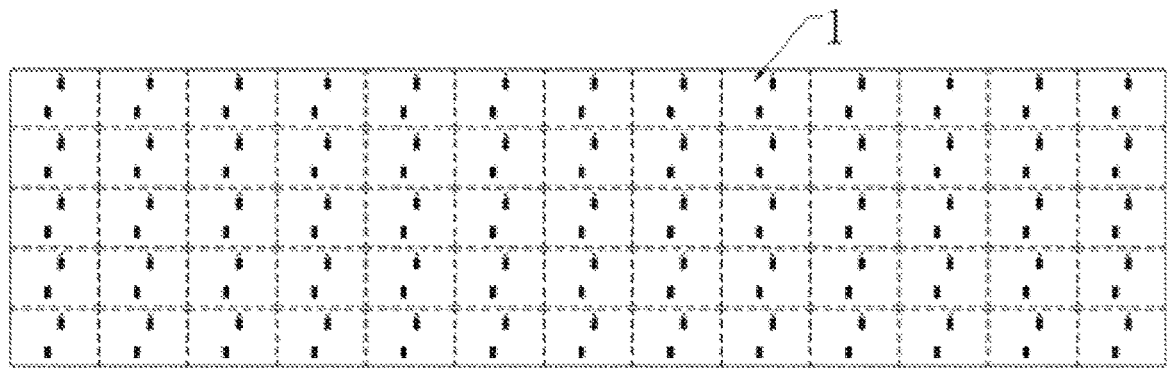
FIG. 1 is a structural schematic diagram showing a 15×13 small chip assembly according to an embodiment of the present invention.
Figure 2:
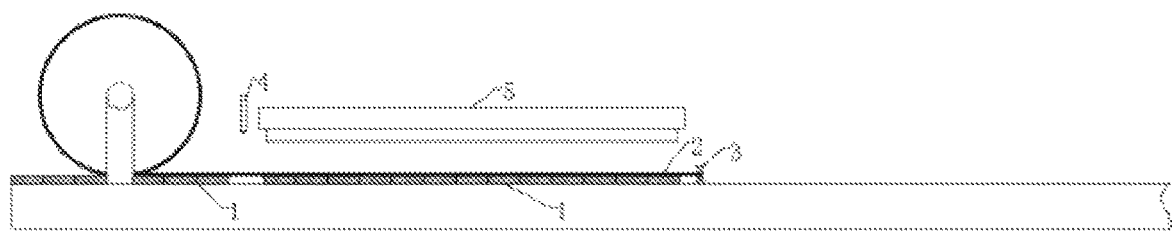
FIG. 2 is a structural schematic diagram showing an interconnected bar pulled out by a required welding length according to Embodiment 1 of the present invention.
Figure 3:
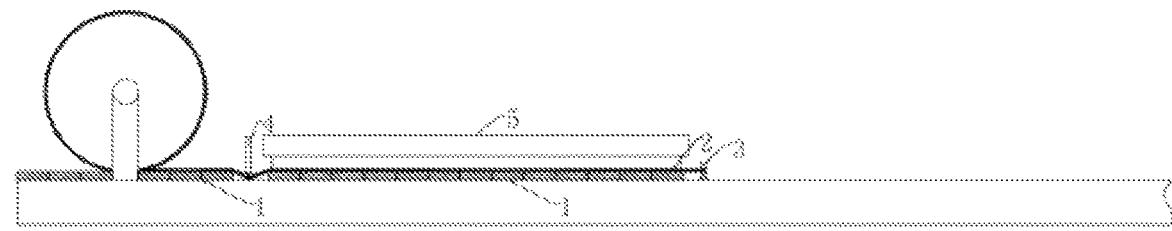
FIG. 3 is a structural schematic diagram showing that a welding head moves down for welding after a pressing block is pressed down to fix the interconnected bar according to Embodiment 1 of the present invention.
Figure 4:
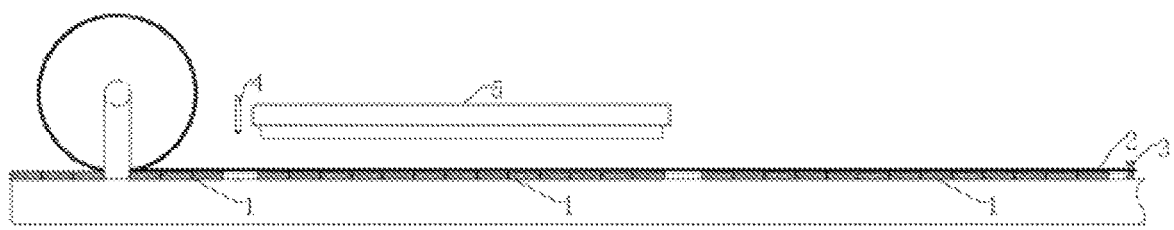
FIG. 4 is a structural schematic diagram showing that the small chip assembly and the interconnected bar move forward one chip station after the welding head and the pressing block are lifted according to Embodiment 1 of the present invention.
Figure 5:
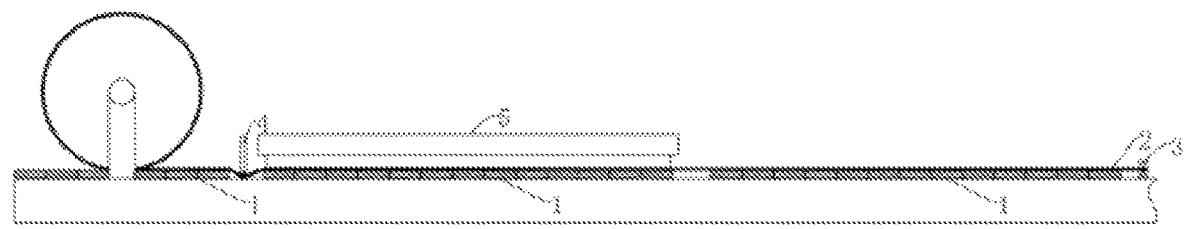
FIG. 5 is a structural schematic diagram showing the welding of a second small chip assembly according to Embodiment 1 of the present invention.
Figure 6:
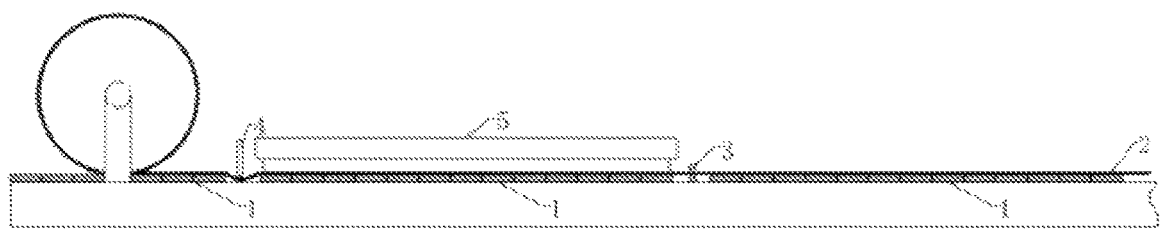
FIG. 6 is a structural schematic diagram showing that a chuck is loosened back to the front of the second small chip assembly in welding according to Embodiment 1 of the present invention.
Figure 7:
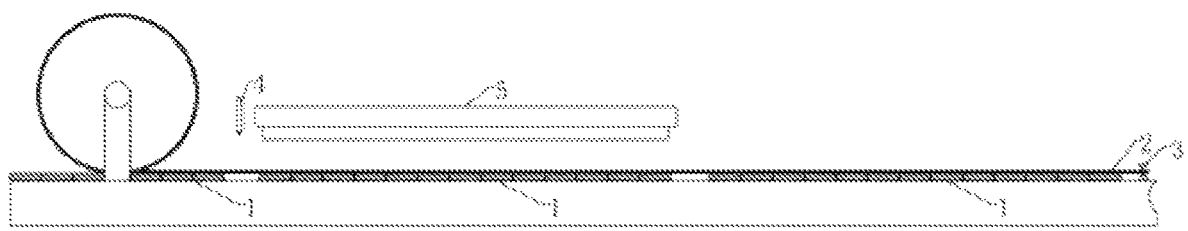
FIG. 7 is a structural schematic diagram showing that the welding steps of the interconnected bar are repeated according to Embodiment 1 of the present invention.
Figure 8:
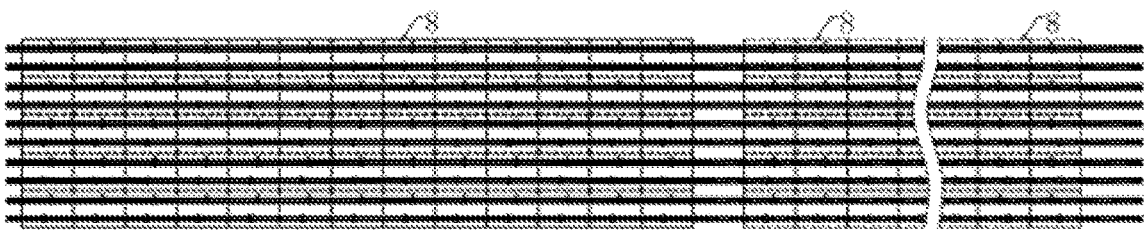
FIG. 8 is a structural schematic diagram showing a welded small cell string according to Embodiment 1 of the present invention.
Figure 9:
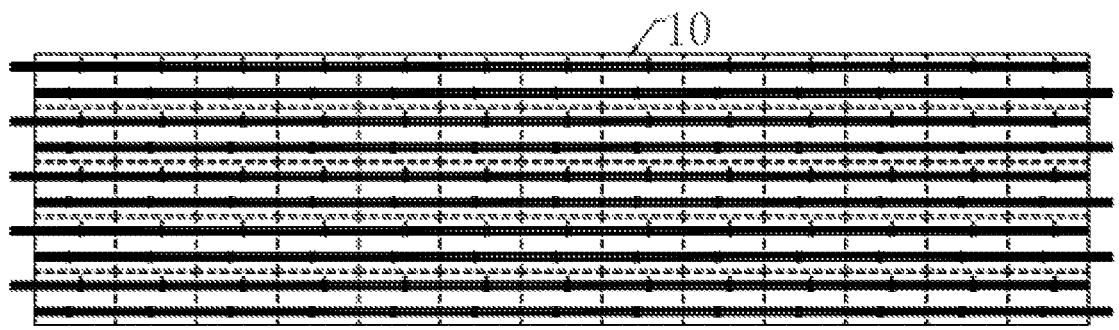
FIG. 9 is a structural schematic diagram showing a small cell assembly obtained by cutting or punching according to Embodiment 1 of the present invention.
Figure 10:
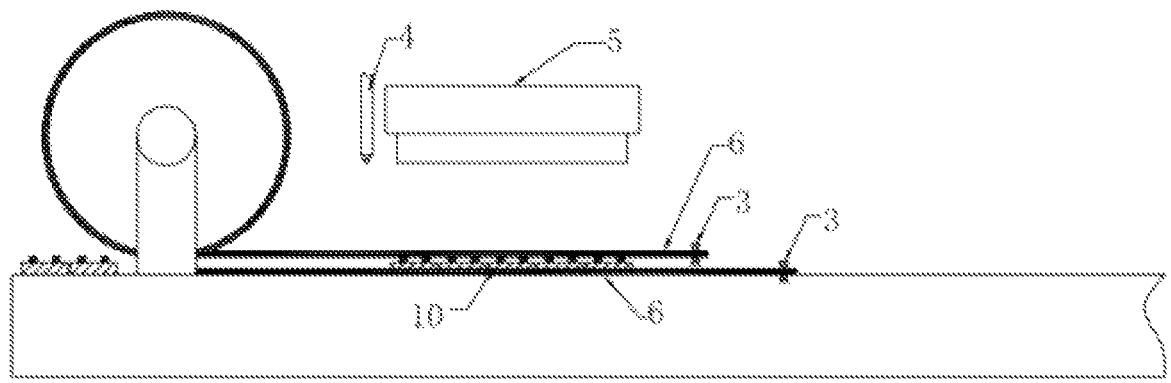
FIG. 10 is a structural schematic diagram showing a bus bar pulled out by a required welding length according to Embodiment 1 of the present invention.
Figure 11:
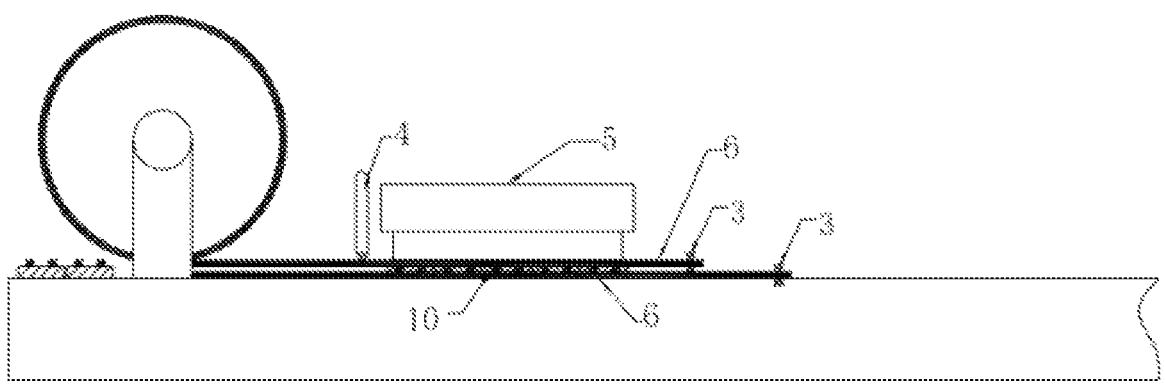
FIG. 11 is a structural schematic diagram showing that the welding head moves down for welding after the pressing block is pressed down to fix the bus bar according to Embodiment 1 of the present invention.
Figure 12:
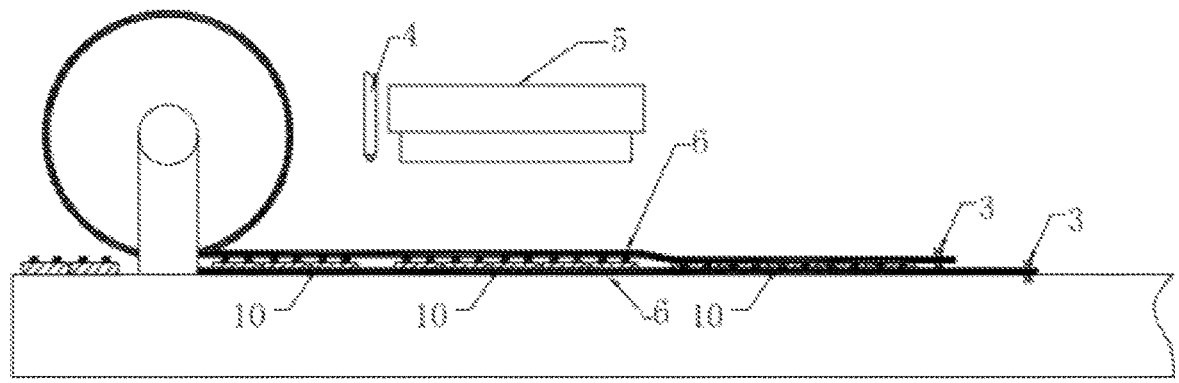
FIG. 12 is a structural schematic diagram showing that the small cell assembly and the bus bar move forward one chip station after the welding head and the pressing block are lifted according to Embodiment 1 of the present invention.
Figure 13:
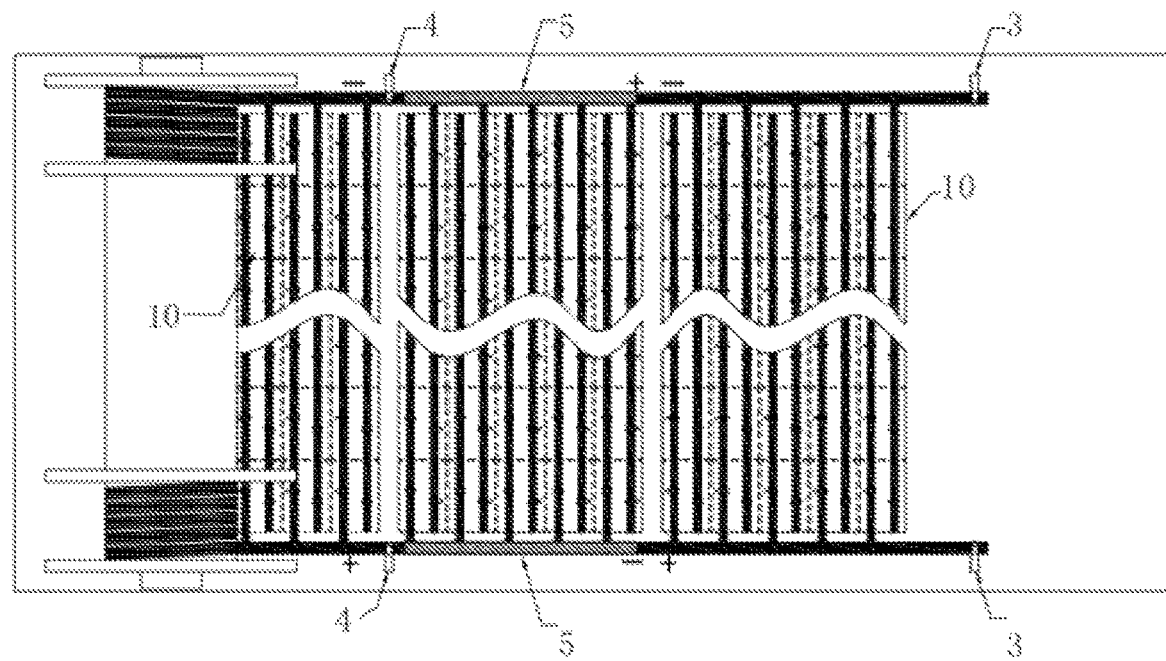
FIG. 13 is a structural schematic diagram showing the cross-feeding welding of positive and negative electrodes of the small cell assemblies according to Embodiment 1 of the present invention.
Figure 14:
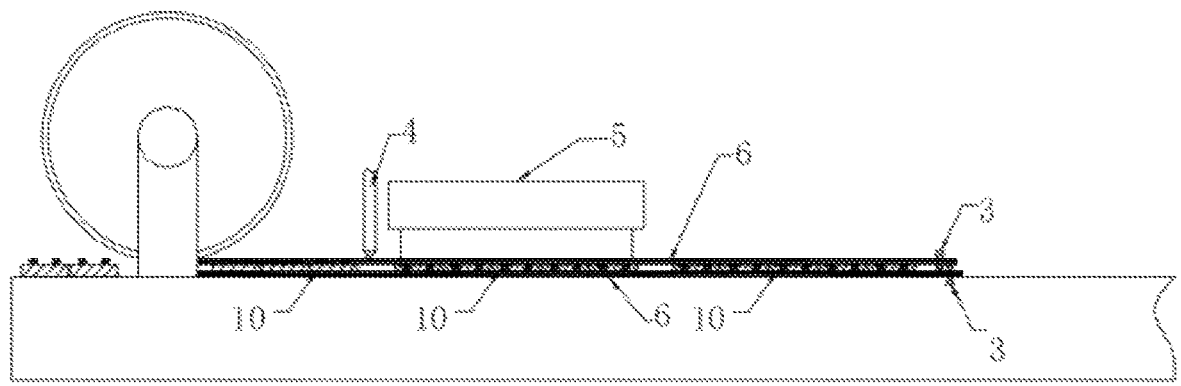
FIG. 14 is a structural schematic diagram showing the welding of a second small cell assembly according to Embodiment 1 of the present invention.
Figure 15:
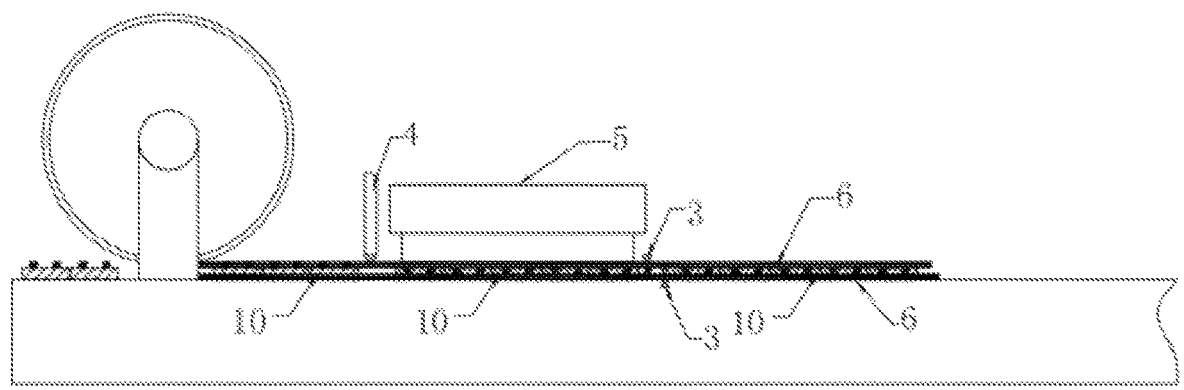
FIG. 15 is a structural schematic diagram showing that the chuck is loosened back to the front of the second small cell assembly in welding according to Embodiment 1 of the present invention.
Figure 16:
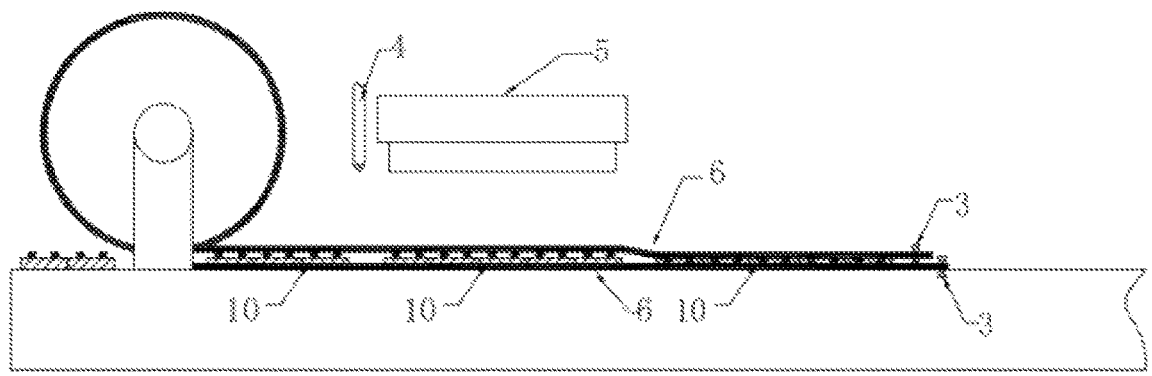
FIG. 16 is a structural schematic diagram showing that welding steps of the bus bar are repeated according to Embodiment 1 of the present invention.
Figure 17:
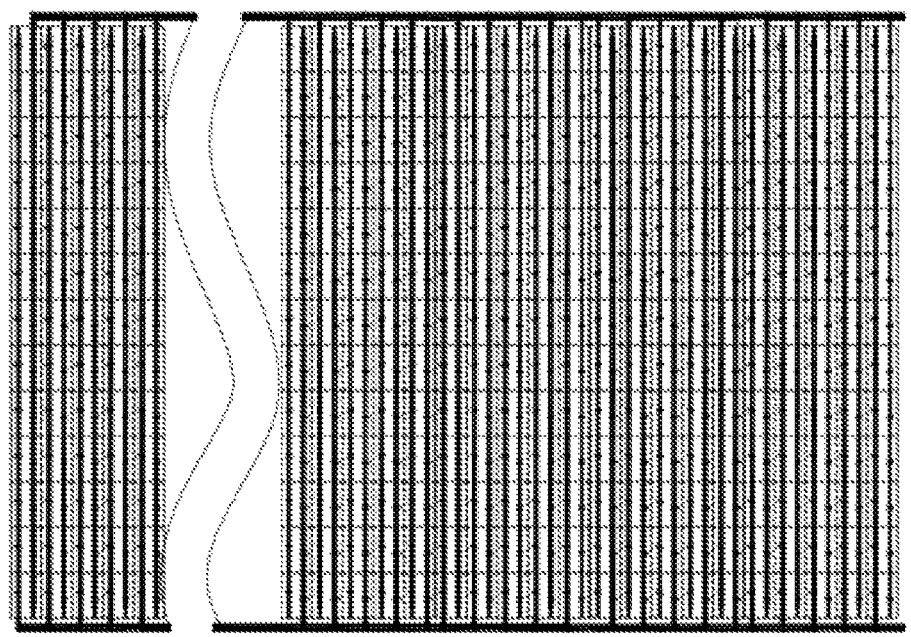
FIG. 17 is a structural schematic diagram showing that the small cell assemblies are welded to reach a required length of a finished assembly product according to Embodiment 1 of the present invention.
Figure 18:
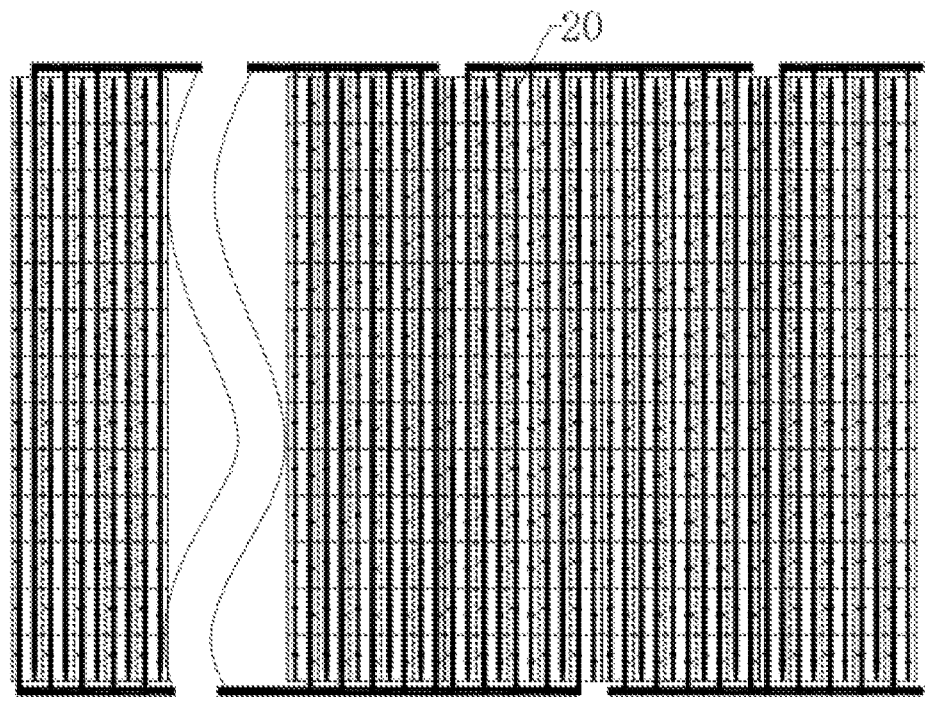
FIG. 18 is a structural schematic diagram showing cell assemblies connected in series that are obtained by cutting or punching according to Embodiment 1 of the present invention.
Figure 19:
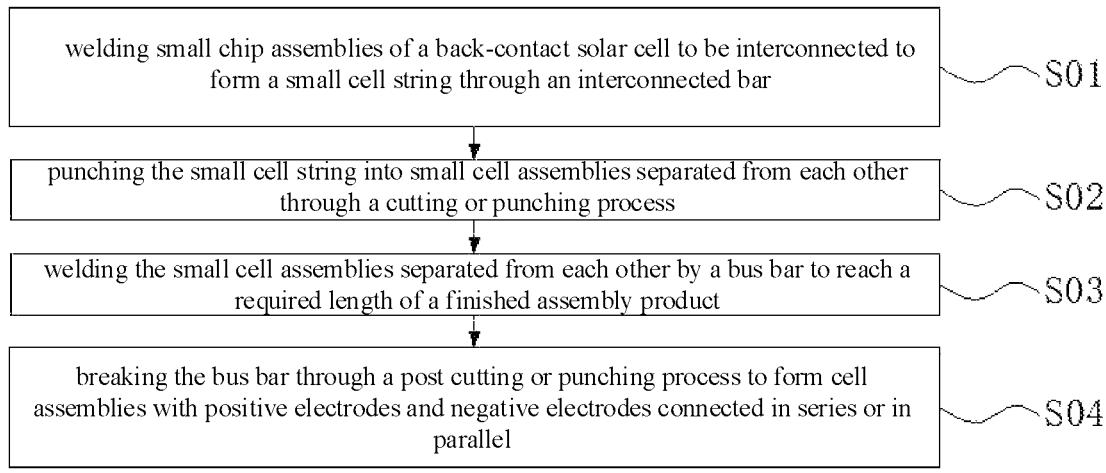
FIG. 19 is a flow chart showing a welding method for a welding strip of a back-contact solar cell chip according to the present invention.

Referring to FIGS. 1-19, a welding method for a welding strip of a back-contact solar cell chip includes the following steps:

S01: the small chip assemblies 1 of the back-contact solar cell are welded to be interconnected to form the small cell string 8 through the interconnected bar 2.

Specifically, the small chip assembly 1 of the back-contact solar cell is formed by attaching a protective layer to the arranged 5×13 small cell chips affixed with an ultraviolet ray (UV) film. The small chip assembly 1 of the back-contact solar cell is transmitted to a welding station through an automatic conveying belt. The welding surface of the small chip assembly is facing up, and the surface of the attached protective layer is facing down. The pressing block 4 for fixing the welding strip is pressed down to fix the interconnected bar 2 after the interconnected bar 2 is clamped by the chuck 3 and is pulled out by the required welding length, so that the interconnected bar 2 is smoothly distributed on the surface of the small chip assembly 1. The infrared welding head 5 moves down to touch the interconnected bar 2 to start welding, so that the interconnected bar 2 is uniformly and firmly fused with the welding joint of the small chip assembly 1, and the welding of the first small chip assembly 1 is completed. After the infrared welding head 5 and the pressing block 4 for fixing the welding strip are lifted, the conveying belt automatically moves forward one chip station, and the chuck 3 pulls the front end of the interconnected bar 2 to move forward one chip station simultaneously, then the second small chip assembly 1 is in place. The infrared welding head 5 moves down to touch the interconnected bar 2 to start the welding of the second small chip assembly 1 after the pressing block 4 for fixing the welding strip is pressed down to fix the interconnected bar 2; meanwhile, the chuck 3 in the front of the first small chip assembly 1 is loosened back to the front of the second small chip assembly 1 to clamp the interconnected bar 2. The pressing block 4 for fixing the welding strip and the infrared welding head 5 are lifted after the welding of the second small chip assembly 1 is completed, and the small chip assembly 1 and the interconnected bar 2 move forward one chip station simultaneously. The above welding steps are repeated until N small chip assemblies 1 are welded to be interconnected to form the small cell string 8.

S02: the small cell string 8 is punched into the small cell assemblies 10 separated from each other through the cutting or punching process.

S03: the small cell assemblies 10 are welded by the bus bar 6 to reach the required length of the finished assembly product.

Specifically, the small cell assembly 10 is transmitted to the welding station through an automatic conveying belt, and the bus bar 6 is clamped by the chuck to be pulled to the required length. The top and bottom of the small cell assembly 10 are respectively laid with the bus bar 6 using the double-layer clamping welding for welding the bus bar 6. The pressing block 4 for fixing the bus bar is pressed down to fix the bus bar 6, so that the bus bar 6 is tightly attached to the interconnected bar 2. The infrared welding head 5 moves down to start welding, so that the welding of the first small cell assembly 10 is completed. After the infrared welding head 5 and the pressing block 4 for fixing the bus bar are lifted, the conveying belt automatically moves forward one chip station, and the chuck 3 clamps the front end of the bus bar 6 to move forward one chip station simultaneously, then the second small cell assembly 10 is in place. The infrared welding head 5 is pressed down to perform a welding of the second small cell assembly 10 after the pressing block 4 for fixing the bus bar is pressed down to fix the bus bar 6; meanwhile, the chuck 3 in the front of the first small cell assembly 10 is loosened back to the front of the second small cell assembly 10 to clamp the bus bar 6. The pressing block 4 for fixing the bus bar and the infrared welding head 5 are lifted after the welding of the second small cell assembly 10 is completed, and the small cell assembly 10 and the bus bar 6 move forward one chip station simultaneously. The above welding steps are repeated until the required length of the finished assembly product is reached.

S04: the bus bar 6 is broken through the post cutting or punching process to form the cell assemblies 20 with positive and negative electrodes connected in series or in parallel.

The length of the cell assembly 20 can be adjusted through increasing or decreasing the small cell assemblies 10 according to the required power. The adjacent small cell assemblies 10 are fed in a manner of one positive and one negative when the small cell assemblies 10 are connected in series, so that the positive and negative electrodes of the adjacent small cell assemblies 10 are connected to each other during welding to allow all small cell assemblies 10 to be connected in series.

Embodiment 2

Figure 20:
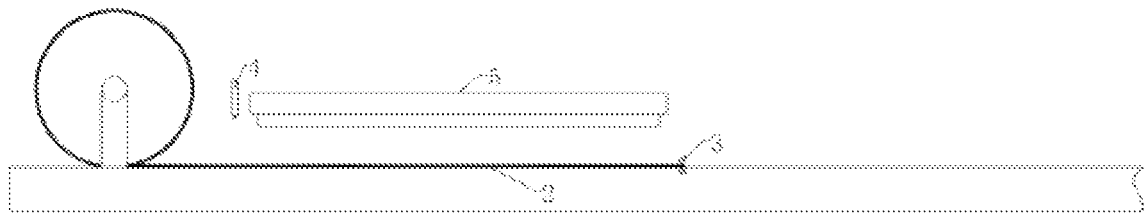
FIG. 20 is a structural schematic diagram showing an interconnected bar pulled out by a required welding length according to Embodiment 2 of the present invention.
Figure 21:
FIG. 21 is a structural schematic diagram showing that the small chip assembly is absorbed and placed on the interconnected bar according to Embodiment 2 of the present invention.
Figure 22:
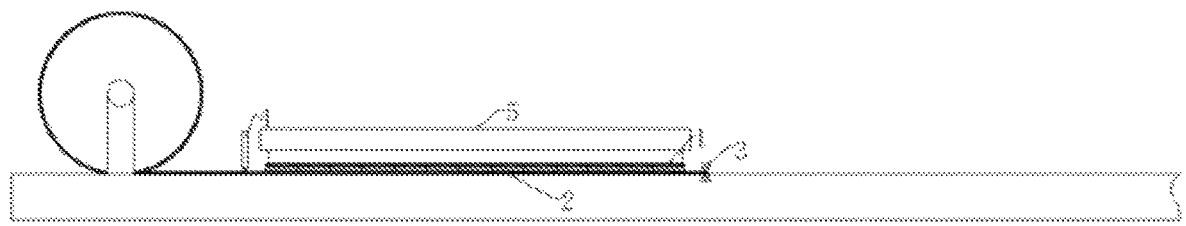
FIG. 22 is a structural schematic diagram showing that a welding head moves down for welding after a pressing block is pressed down to fix the interconnected bar according to Embodiment 2 of the present invention.
Figure 23:
FIG. 23 is a structural schematic diagram showing that a second small chip assembly is grabbed and placed on the interconnected bar after the welding head and the pressing block are lifted and the interconnected bar moves forward one chip station according to Embodiment 2 of the present invention.
Figure 24:
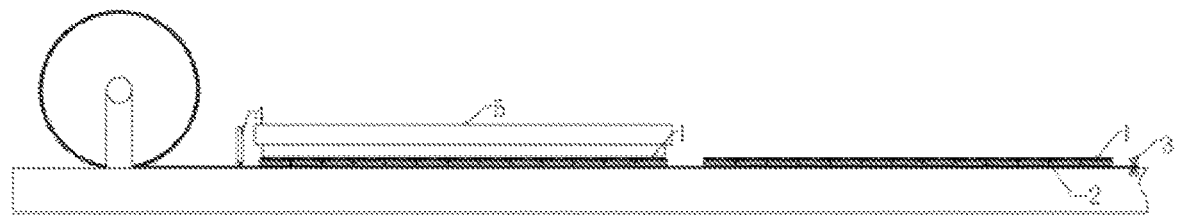
FIG. 24 is a structural schematic diagram showing the welding of the second small chip assembly according to Embodiment 2 of the present invention.
Figure 25:
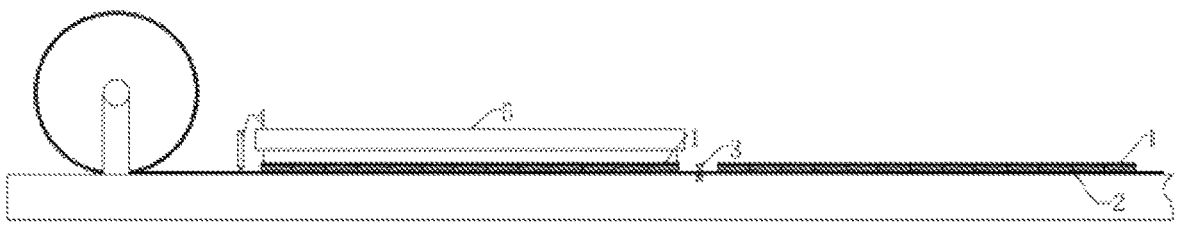
FIG. 25 is a structural schematic diagram showing that a chuck is loosened back to the front of the second small chip assembly in welding according to Embodiment 2 of the present invention.
Figure 26:
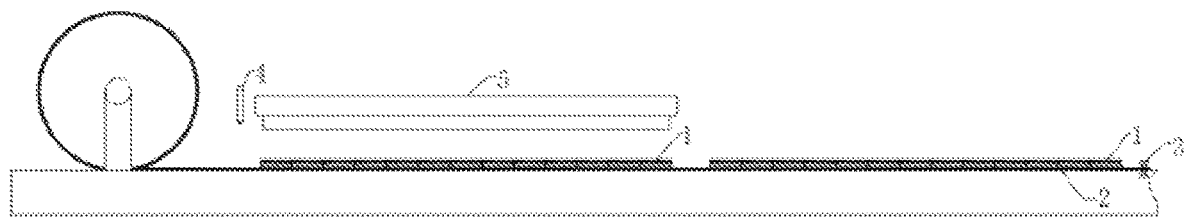
FIG. 26 is a structural schematic diagram showing that welding steps of the interconnected bar are repeated according to Embodiment 2 of the present invention.

Referring to FIGS. 19-26, a welding method for a welding strip of a back-contact solar cell chip includes the following steps:

S01: the small chip assemblies 1 of the back-contact solar cell are welded to be interconnected to form the small cell string 8 through the interconnected bar 2.

Specifically, the interconnected bar 2 is clamped by the chuck 3 and is pulled out by the required welding length. The small chip assembly 1 of the back-contact solar cell is formed by attaching a protective layer to the arranged 5×13 small cell chips affixed with an UV film. The small chip assembly 1 of the back-contact solar cell is absorbed to the interconnected bar at a welding station through a vacuum sucker on an automatic mechanical arm. The welding surface of the small chip assembly is facing down, and the surface of the attached protective layer is facing up. The pressing block 4 for fixing the welding strip is pressed down to fix the interconnected bar 2. The infrared welding head 5 moves down to touch the interconnected bar 2 to start welding, so that the interconnected bar 2 is uniformly and firmly fused with the welding joint of the small chip assembly 1, and the welding of the first small chip assembly 1 is completed. After the infrared welding head 5 and the pressing block 4 for fixing the welding strip are lifted, the chuck 3 pulls the front end of the interconnected bar 2 and simultaneously drives the welded first small chip assembly 1 to move forward one chip station, then the mechanical arm grabs the second small chip assembly 1 to be placed on the interconnected bar 2 at the welding station. The infrared welding head 5 moves down to touch the interconnected bar 2 to start the welding of the second small chip assembly 1 after the pressing block 4 for fixing the welding strip is pressed down to fix the interconnected bar 2; meanwhile, the chuck 3 in the front of the first small chip assembly 1 is loosened back to the front of the second small chip assembly 1 to clamp the interconnected bar 2. The pressing block 4 for fixing the welding strip and the infrared welding head 5 are lifted after the welding of the second small chip assembly 1 is completed, and the interconnected bar 2 moves forward one chip station simultaneously, then the mechanical arm grabs one small chip assembly 1 once again to be placed on the interconnected bar 2 at the welding station. The above welding steps are repeated until N small chip assemblies 1 are welded to be interconnected to form the small cell string 8.

S02: the small cell string 8 is punched into the small cell assemblies 10 separated from each other through the cutting or punching process.

S03: the small cell assemblies 10 are welded by the bus bar 6 to reach the required length of the finished assembly product.

S04: the bus bar 6 is broken through the post cutting or punching process to form the cell assemblies 20 with positive and negative electrodes connected in series or in parallel.

The present invention makes the welding surfaces of the solar cell chips be on the same surface through using the back-contact solar cell chips, so that the interconnected bar of the solar cell chips can be welded rapidly and continuously, and the welding of positive and negative electrodes on the same surface and the welding of multiple main grids at the same time are further achieved without requiring to cut off the interconnected bar, which greatly improves the work efficiency.

In the present invention, a hard protective layer is attached to the surface of the back-contact solar cell chip, thereby reducing the probability of producing defective products in the production process of the solar cell chip.

The small cell assembly formed through the cutting or punching process produced by the present invention can flexibly form the required finished cell assembly. Moreover, when the bus bar is welded, the process of first welding and then cutting or punching is different from the traditional process of first cutting the required length before welding. This reduces the difficulty of the welding process, improves the production efficiency and reduces the production cost.

The above only describes the preferred embodiments of the present invention, which are not used to limit the present invention. Any modifications, equivalent replacements, and improvements made within the spirit and principles of the present invention shall fall within the scope of protection of the present invention.

What is claimed is:

1. A welding method for a welding strip of a back-contact solar cell chip, comprising the following steps:
    welding small chip assemblies of a back-contact solar cell to be interconnected to form a small cell string through an interconnected bar;
    punching the small cell string into small cell assemblies separated from each other through a cutting or punching process;
    welding the small cell assemblies separated from each other by a bus bar to reach a required length of a finished assembly product; and
    breaking the bus bar through a post cutting or punching process to form cell assemblies with positive electrodes and negative electrodes connected in series or in parallel.

2. The welding method for the welding strip of the back-contact solar cell chip according to claim 1, wherein a method for welding the small chip assemblies of the back-contact solar cell to be interconnected to form the small cell string through the interconnected bar comprises: transmitting the small chip assemblies of the back-contact solar cell to a welding station through an automatic conveying belt; pressing down a pressing block for fixing the welding strip to fix the interconnected bar after the interconnected bar is clamped by a chuck and is pulled out by a required welding length, wherein the interconnected bar is smoothly distributed on surfaces of the small chip assemblies; moving an infrared welding head down to touch the interconnected bar to start welding, wherein the interconnected bar is uniformly and firmly fused with welding joints of the small chip assemblies, and a welding of a first small chip assembly of the small chip assemblies is completed; after the infrared welding head and the pressing block for fixing the welding strip are lifted, automatically moving the automatic conveying belt forward one chip station, and pulling, by the chuck, a front end of the interconnected bar to move forward one chip station simultaneously, then allowing a second small chip assembly of the small chip assemblies to be in place; moving the infrared welding head down to touch the interconnected bar to start a welding of the second small chip assembly after the pressing block for fixing the welding strip is pressed down to fix the interconnected bar; meanwhile, loosening the chuck in a front of the first small chip assembly back to a front of the second small chip assembly to clamp the interconnected bar; lifting the pressing block for fixing the welding strip and the infrared welding head after the welding of the second small chip assembly is completed, and moving the small chip assemblies and the interconnected bar forward one chip station simultaneously; and repeating the above welding steps until N small chip assemblies are welded to be interconnected to form the small cell string.

3. The welding method for the welding strip of the back-contact solar cell chip according to claim 2, wherein the small chip assemblies are formed by attaching a protective layer to arranged 5×13 small cell chips affixed with an ultraviolet ray (UV) film; welding surfaces of the small chip assemblies are facing up, and a surface of the protective layer is facing down.

4. The welding method for the welding strip of the back-contact solar cell chip according to claim 2, the interconnected bar is arranged under the small chip assemblies to be welded; the small chip assemblies are absorbed and transmitted to the welding station through a vacuum sucker on an automatic mechanical arm; welding surfaces of the small chip assemblies are facing down, and a surface of an attached protective layer is facing up.

5. The welding method for the welding strip of the back-contact solar cell chip according to claim 1, wherein a method for welding the small cell assemblies separated from each other by the bus bar to reach the required length of the finished assembly product comprises: transmitting the small cell assemblies to a welding station through an automatic conveying belt, and clamping and pulling the bus bar by a chuck to a required length; pressing a pressing block for fixing the bus bar down to fix the bus bar, wherein the bus bar is tightly attached to the interconnected bar; moving an infrared welding head down to start welding, wherein a welding of a first small cell assembly of the small cell assemblies is completed; after the infrared welding head and the pressing block for fixing the bus bar are lifted, automatically moving the automatic conveying belt forward one chip station, and clamping, by the chuck, a front end of the bus bar to move forward one chip station simultaneously, then allowing a second small cell assembly of the small cell assemblies to be in place; pressing the infrared welding head down to perform a welding of the second small cell assembly after the pressing block for fixing the bus bar is pressed down to fix the bus bar; meanwhile, loosening the chuck in a front of the first small cell assembly back to a front of the second small cell assembly to clamp the bus bar; lifting the pressing block for fixing the bus bar and the infrared welding head after the welding of the second small cell assembly is completed, and moving the small cell assemblies and the bus bar forward one chip station simultaneously; and repeating the above welding steps until the required length of the finished assembly product is reached.

6. The welding method for the welding strip of the back-contact solar cell chip according to claim 4, wherein the bus bar is welded by using a single-layer welding or a double-layer clamping welding, and tops of the small cell assemblies and bottoms of the small cell assemblies are respectively laid with the bus bar when the double-layer clamping welding is used.

7. The welding method for the welding strip of the back-contact solar cell chip according to claim 4, wherein adjacent small cell assemblies of the small cell assemblies are fed in a manner of one positive and one negative when the small cell assemblies are connected in series, wherein a positive electrode of a first small cell assembly of the adjacent small cell assemblies and a negative electrode of a second small cell assembly of the adjacent small cell assemblies are connected to each other during welding to allow all the small cell assemblies to be connected in series.

\* \* \* \* \*